United States Patent [19]

Lu

[11] Patent Number: 5,429,701
[45] Date of Patent: Jul. 4, 1995

[54] METHOD OF ELECTRICALLY INTERCONNECTING CONDUCTORS

[75] Inventor: Neng-Hsing Lu, Hsinchu, Taiwan

[73] Assignee: Industrial Technology Research Institute, Hsinchu, Taiwan

[21] Appl. No.: 230,904

[22] Filed: Apr. 21, 1994

Related U.S. Application Data

[63] Continuation-in-part of Ser. No. 868,290, Apr. 14, 1992, abandoned.

[51] Int. Cl.⁶ .............................................. B32B 31/00
[52] U.S. Cl. .................. 156/272.4; 156/275.5; 156/275.7
[58] Field of Search ............... 156/272.4, 272.2, 275.7, 156/275.5

[56] References Cited

U.S. PATENT DOCUMENTS

| | | |
|---|---|---|
| 3,359,145 | 12/1967 | Salyer . |
| 3,654,853 | 4/1972 | Fayling . |
| 4,113,981 | 9/1978 | Fujita . |
| 4,170,677 | 10/1979 | Hutcheson . |
| 4,546,037 | 10/1985 | King . |
| 4,548,862 | 10/1985 | Hartman . |
| 4,644,101 | 2/1987 | Jin et al. .................. 178/18 |
| 4,667,401 | 5/1987 | Clements et al. . |
| 4,720,740 | 1/1988 | Clements et al. . |
| 4,737,112 | 4/1988 | Jin et al. .................. 264/24 |
| 4,820,376 | 4/1989 | Lambert et al. . |
| 4,838,347 | 6/1989 | Dentini et al. . |
| 4,937,995 | 7/1990 | Deffeyes . |
| 5,147,573 | 9/1992 | Chagnon . |
| 5,207,841 | 5/1993 | Shigeta . |
| 5,250,228 | 10/1993 | Baigrie et al. . |

*Primary Examiner*—Chester T. Barry
*Attorney, Agent, or Firm*—Spencer, Frank & Schneider

[57] ABSTRACT

A method of electrically interconnecting conductors, such as electrical components to a printed circuit board. A plurality of first and second conductors are provided which are discrete and at least one of which is made of soft magnetic material that can be temporarily magnetized. The plurality of first conductors are arranged in a predetermined arrangement on a surface of a substrate. An adhesive layer comprised of a mixture is disposed on the surface of the substrate and over the plurality of first conductors. The mixture is comprised of an adhesive and a predetermined concentration of conductive metal particles made of soft magnetic materials that can be temporarily magnetized. The adhesive has a predetermined viscosity which allows the conductive metal particles to be suspended within the adhesive. The mixture is substantially insulating at the predetermined concentration of conductive metal particles. The plurality of second conductors are arranged above the adhesive layer in vertical alignment with the individual conductors of the plurality of first conductors. The adhesive layer is heated to reduce the viscosity of the mixture. A magnetic field is applied such that the conductive metal particles within the heated adhesive mixture are gathered by the magnetic field to produce a higher concentration of conductive metal particles between the aligned individual conductors of the plurality of first and the second conductors, and provide electrical interconnection therebetween, and to produce a lower concentration of conductive metal particles in adjacent areas of the layer; and hardening the adhesive layer.

7 Claims, 5 Drawing Sheets

METHOD OF ELECTRICALLY INTERCONNECTING CONDUCTORS

CROSS REFERENCE TO RELATED APPLICATION

This application is a continuation-in-part of U.S. patent application Ser. No. 07/868,290, filed Apr. 14, 1992, now abandoned which is hereby incorporated by reference.

BACKGROUND OF THE INVENTION

The present invention relates to a method of interconnecting conductors, and more specifically, to a method utilized for electrically interconnecting an electrical component, such as an IC package, having a plurality of conducting terminals to a printed circuit board (PCB).

A conventional method for interconnecting an IC package to a PCB is to use soldering techniques. Since the pins of the IC package are arranged with very close spacings, 30 mil in general, precise dot deposition is required to place solder only upon the pins and not therebetween. Furthermore, soldering techniques require temperatures high enough to melt the solder so that both the IC package and the printed circuit board must be able to withstand such high temperatures.

A number of methods therefore have been proposed to eliminate the use of solders in electrically interconnecting IC packages to PCBs. A U.S. Pat. No. 4,820,376 issued to Lambert et al, discloses the use of a conductive polymer interconnect material (CPI) having a plurality of chains of electrically conducting particles. A sheet made of the CPI material can be disposed onto the surface of a PCB. When the disposed sheet is pressed by the pins of an IC package, the conducting particle chains therewithin electrically connect the pins to the PCB. Since the conducting particles chains are randomly distributed and are also fixed within the CPI material, they can not be moved so as to be gathered at specific positions.

In U.S. Pat. Nos. 4,667,401, 4,720,740, and 4,868,637 issued to Clements et al; there are disclosed the use of an adhesive of dielectric polymeric resin having a viscosity in the range of 10,000 cps to 40,000 cps and 20 wt % to 25 wt % conductive metal particles. The adhesive is coated uniformly onto the surface of a PCB and afterwards an IC package is pressed onto the coated layer so that portions of the adhesives that are distributed on the conductive strips of the PCB are pressed by the pins of the IC package. The pressed portions are thereby reduced in volume such that the concentrations of conductive metal particles at these points are increased to 45–50 percent by weight. In accordance with a TABLE 1 given in the specification of U.S. Pat. No. 4,667,401, the resistance value of an adhesive having 20 wt % to 25 wt % conductive metal particles is greater than $10^{14}$ Ω and that of adhesive having 45 wt % to 50 wt % conductive metal particles is less than 1Ω. As a result, although the pins of the IC package are submerged into a same layer of adhesive, electrical connections are established between the pins of the IC package and the conducting strips of the PCB and while there are still excellent insulations among the pins of the IC package.

The method according to the patents of Clements et al; however, suffers from high failure rate of electrical connections since the establishment of an electrical connection requires that the concentration of conductive metal particles exceed a threshold value (somewhere between 40 wt % and 45 wt %), the denser the better. To concentrate the conductive metal particles merely by pressing the adhesive is somewhat a rough method that can not guarantee high successful rates of electrical connections.

Jin et al, in their U.S. Pat. No. 4,737,112 disclose an electrical interconnection which is established by means of an anisotropically conductive, composite layer medium comprising electrically conductive particles in a nonconductive matrix material. Magnetic field is applied to align the conductive particles to form electrically conducting chains.

Hutcheson in his U.S. Pat. No. 4,170,677 dislcoses a method of making electrical connections between large-scale integrated circuit boards or the like using a plastic adhesive charged with conductive particles. The method includes the steps of: coating the board with a conductive-whisker charged plastic adhesive, placing another board on the adhesive coating; applying an aligning field to make the conductive whisker align perpendicular to the boards, and hardening the adhesive while the field is applied. However, as can be seen from FIG. 2 of Hutcheson's patent, applying magnetic field can only make the conductive whiskers align perpendicular to the boards, but not gather. Therefore, the method of Hutcheson is the same as that of Jin et al; and can not guarantee high successful rates of electrical connections.

SUMMARY OF THE INVENTION

It is therefore an object of the invention to provide an improved method capable of gathering the conductive metal particles contained in an adhesive disposed between two conductors to predetermined positions so as to guarantee the electrical connections between the two conductors.

In accordance with the object of the present invention, a method of electrically interconnecting first conductors to second conductors is provided. The first step of the method is to provide first and second discrete conductors. The second step of the method is to dispose an adhesive including a mixture of dielectric polymeric resin having a viscosity of 10,000 cps to 40,000 cps and 10 wt % to 35 wt % of conductive metal particles made of soft magnetic materials between the first conductors and the second conductors. The third step of the method is to heat the mixture so as to reduce the viscosity of the adhesive. The fourth step of the method is to apply a magnetic field in the range from 200 Gauss to 4000 Gauss to the first conductor and the second conductor such that the conductive metal particles within the adhesive are gathered by magnetic forces between the first conductor and the second conductor. And the final step of the method is to harden the adhesive.

According to an aspect of the method of the invention, at least one of the first and second conductors is made of soft magnetic material.

According to another aspect of the method of the invention, the adhesive mixture is heated to a temperature of 50° C. to 90° C. before applying the magnetic field so as to reduce the viscosity of the mixture to 1000 cps.

BRIEF DESCRIPTION OF THE DRAWINGS

The present invention can be more fully understood by reading the subsequent detailed description of the preferred embodiments thereof with references made to the accompanying drawings, wherein.

DETAILED DESCRIPTION OF THE PREFERRED EMBODIMENTS

The method according to the present invention will be described below with examples.

EXAMPLE 1

Figure 1:
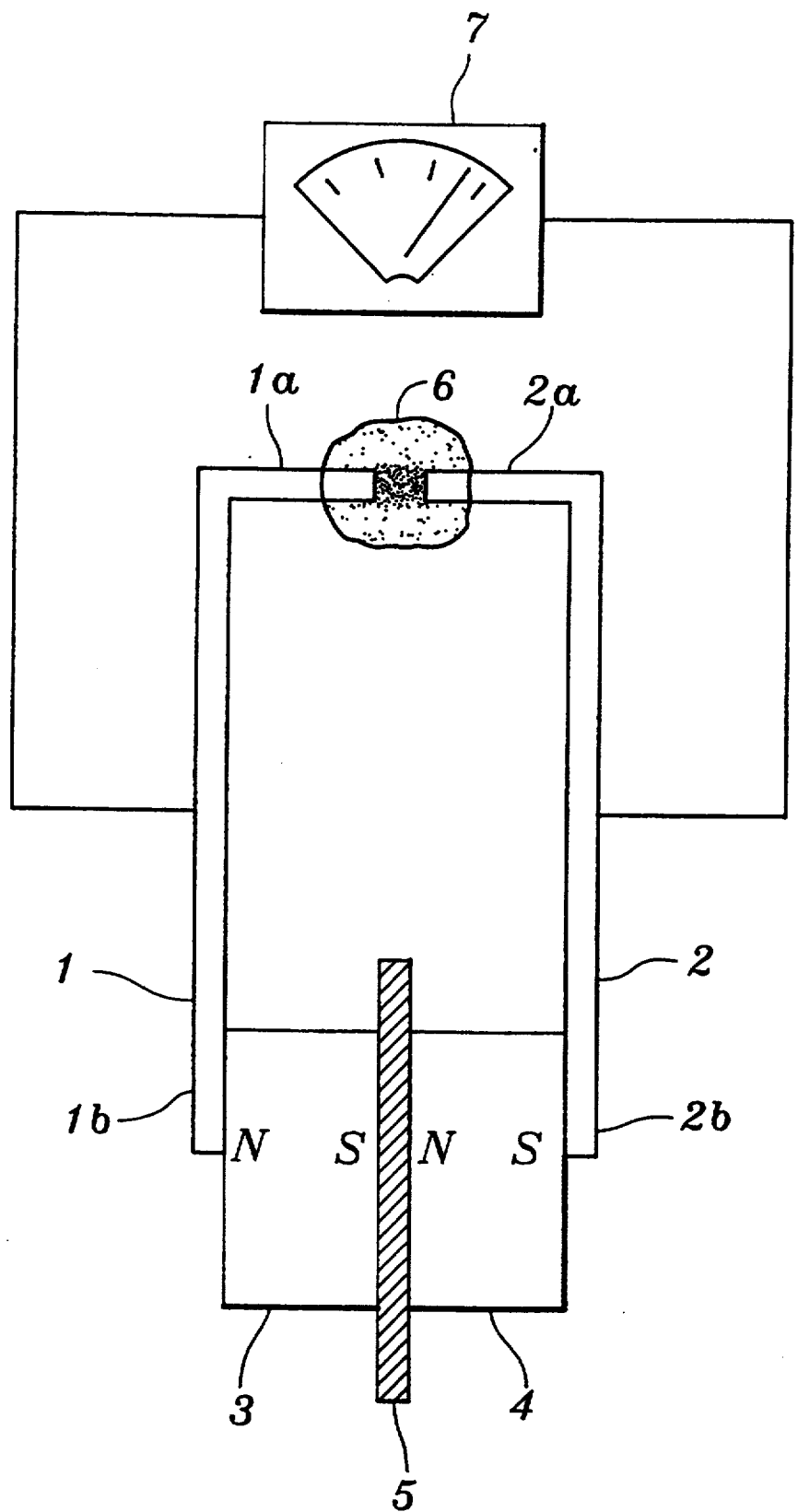
FIG. 1 is a schematic illustration, showing the connection of two conductive wires by a method according to the present invention.

Referring to FIG. 1, the first example is directed to an electrical connection between a first conductive wire 1 and a second conductive wire 2, i.e, an end 1a of the first conductive wire 1 is to be connected to an end 2a of the second conductive wire 2. The spacing between the two ends 1a, 2a is arranged to be about 3 mil.

A mixture 6 of dielectric polymeric resin having a viscosity of 10,000 cps to 40,000 cps and 10 wt % to 35 wt % of Ni particles is disposed at the spacing between the two ends 1a and 2a of the two conductive wires 1, 2. The conductive metal particles used herein should be specifically made of soft magnetic materials such as nickle so that they can be attracted by magnetic forces but will not possess permanent magnetism after the removing of the magnetic forces.

Thereafter, the other end 1b of the first conductive wire 1 is attached to the N-pole of a first magnet 3 and the other end 2b of the second conductive wire 2 is attached to the S-pole of a second magnet 4. An insulator 5 is arranged between the two magnets 3, 4. With this arrangement, the end 1a of the first conductive wire 1 is induced into an N-pole and the end 2b of the second wire 2 is induced into an S-pole. The magnetic field therebetween about 3000 Gauss. The Ni particles contained within the mixture 6 are thereby attracted by the magnetic field to be gathered about the spacing between the two ends 1a, 2a of the two conductive wires 1, 2.

A galvanometer 7 can be used to measure the resistance value across the ends 1a, 1b of the two conductive wires 1, 2. Without being attached to the magnets 3, 4, the resistance value across the ends 1a, 1b of the two conductive wires 1, 2 is measured to be nearly infinite. However, with the accumulation of Ni particles due to the magnetic field, the resistance value is measured to be only about 3Ω. Such a low resistance value is generally regarded as conductive.

Heat can then be added to the mixture 6 to harden the dielectric polymer resin contained therein. After the dielectric polymer resin is hardened, the two ends 1a, 2a of the wires 1 and 2 are securely bonded. The hardening can also be achieved by illuminating the mixture with a infra-red light beam.

The foregoing example is a test used to demonstrate a principle applied by the present invention. The method according to the present invention would have great utilization values when applied to electrical connections between an IC package having a plurality of pins and a PCB having a plurality of conducting strips, as described below by way of the second example.

EXAMPLE 2

The second example is related to an electrical connection between an IC package and a printed circuit board (PCB). More specifically, the pins of the IC package are to be electrically connected to the conducting strips provided on the surface of the PCB. The second example of the method according to the present invention includes several procedural steps which will be described one after the other by referring to the illustrations shown in FIGS. 2A-2F.

STEP (1): Coating an Adhesive Layer with Suspended Ni Particles unto the PCB (FIGS. 2A-2B)

Figure 2A:
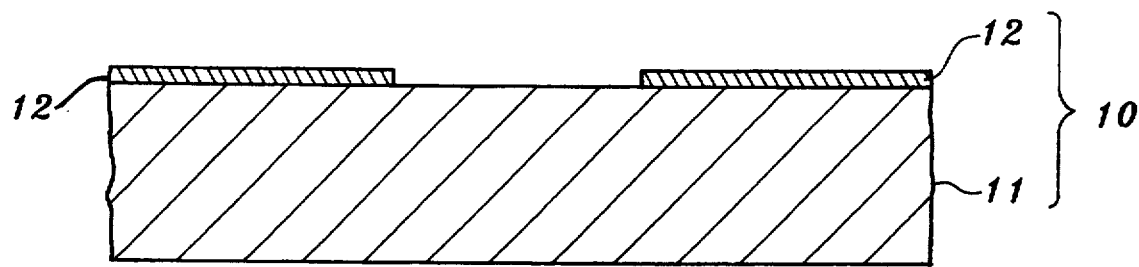
FIGS. 2A-2F are illustrations utilized for showing each of the procedural steps in a method according to the present invention for electrically connecting an IC package to a printed circuit board.
Figure 2B:
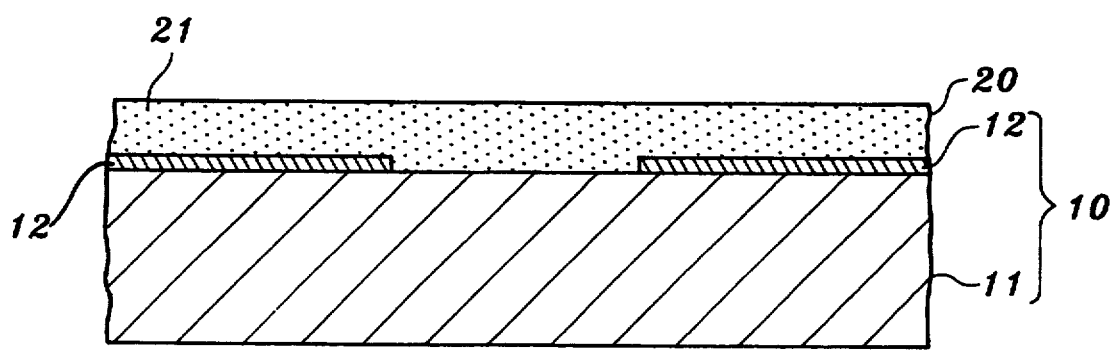

Referring to FIG. 2A, there is shown a PCB 10 which includes a plurality of conducting strips 12 arranged on the surface of a substrate 11. As shown in FIG. 2B, a mixture of dielectric polymeric resin having a viscosity of 10,000 cps(25° C.) and 20 wt % to 25 wt % of Ni particles 21 is coated uniformly onto the surface of the PCB 10 to form an adhesive layer 20 having a thickness of about 3 mil. The polymeric resin used is Epon 828(Epoxy resin, Shell Co.).

STEP (2): Positioning an IC Package on the Adhesive Layer (FIG. 2C)

Figure 2C:
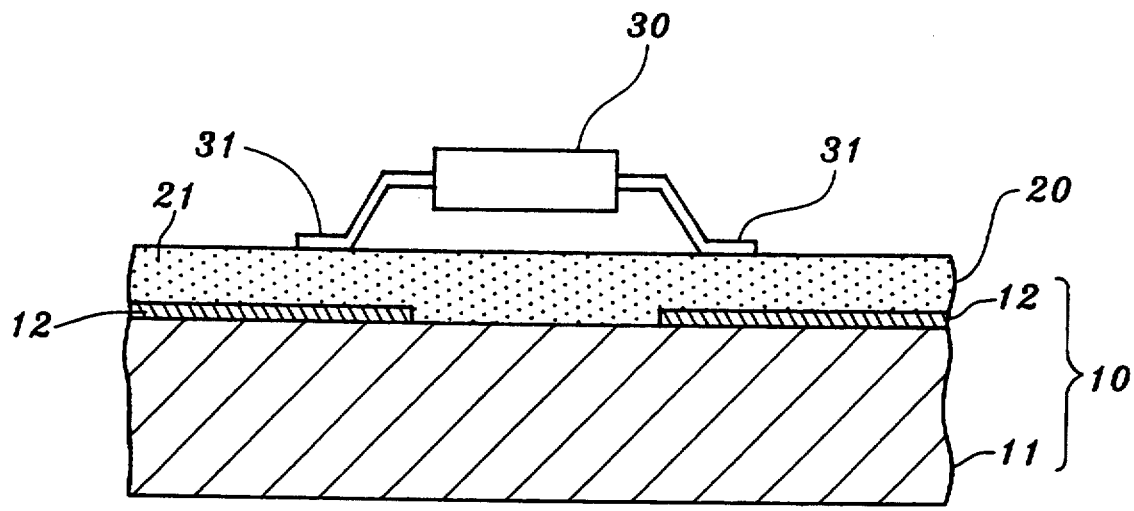

As shown in FIG. 2C, an IC package 30 having a plurality of conductive terminals (pins) 31, that is to be electrically connected to the conducting strips 12 of the PCB 10 is placed by an SMD apparatus (not shown) to come into slight contact with the surface of the adhesive layer 20, with the pins 31 of the IC package 30 right on the top of their corresponding conducting strips.

The pins 31 of the IC package 30 are made of an alloy of FeNi which is a soft magnetic material that can be temporarily magnetized. At this step, the pins 31 of the IC package 30 are not placed to be submerged into the adhesive layer 20.

Figure 2D:
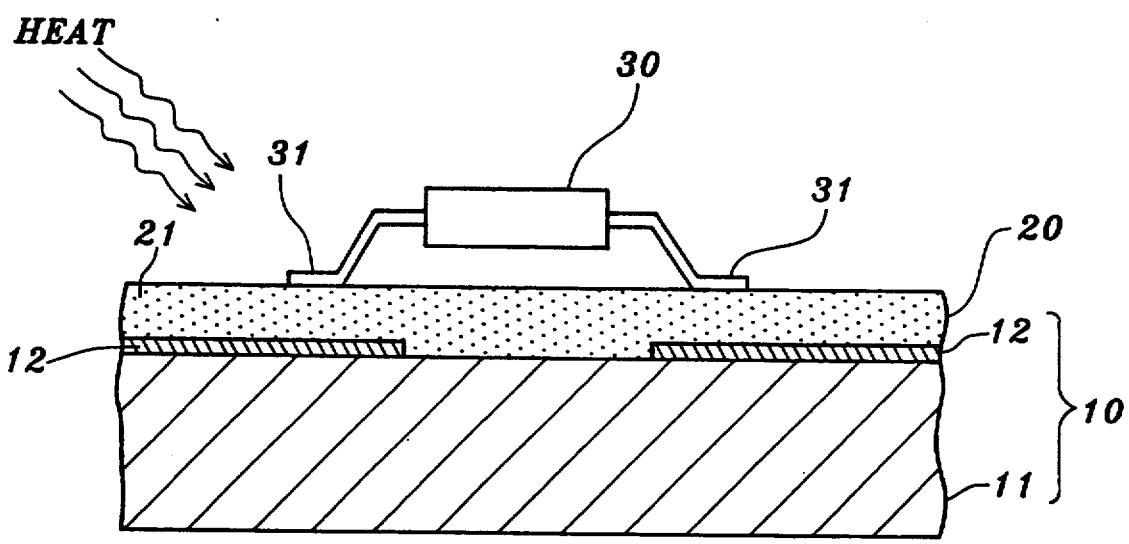

STEP (3) Heating the Polymeric Resin (FIG. 2D)

After the IC package was positioned on the adhesive layer, a temperature of 50° C. was applied to the adhesive to reduce the viscosity of the adhesive from 10,000 cps to about 600 cps. This step faciliates the gathering of Ni particles in the adhesive mixture in the subsequent step of applying a magnetic field.

STEP (4): Applying a Magnetic Field (FIG. 2E)

Figure 2E:
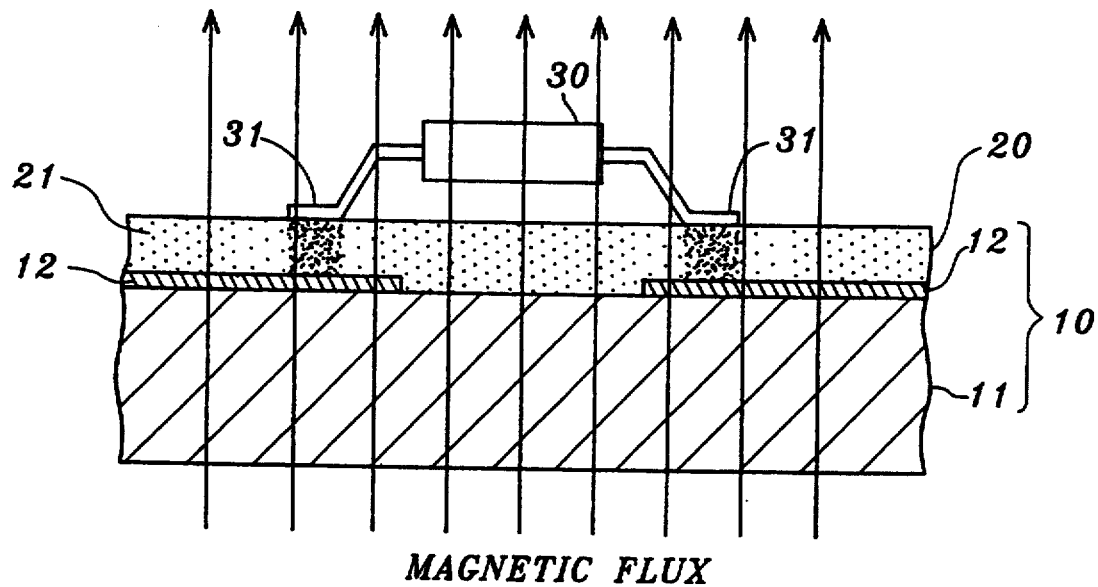

Subsequently, a magnetic field with an intensity in the range from 200 Gauss to 2000 Gauss is applied in a normal direction to the PCB 10 as shown in FIG. 2E. With the application of the magnetic field, the pins 31 of the IC package 30 and the conducting strips 12 of the PCB 10 are magnetized respectively into an N-pole and an S-pole such that the Ni particles 21 suspended within the adhesive layer 20 are attracted by magnetic forces to be gathered between each of the spacings between the pins 31 of the IC package 30 and the conducting strips 12 of the PCB 10. The portions of the adhesive layer 20 that are disposed under the pins 31 of the IC package 30 are therefore crowded with attracted Ni particles such that the percent by weight of Ni particles at these points are increased.

Figure 2F:
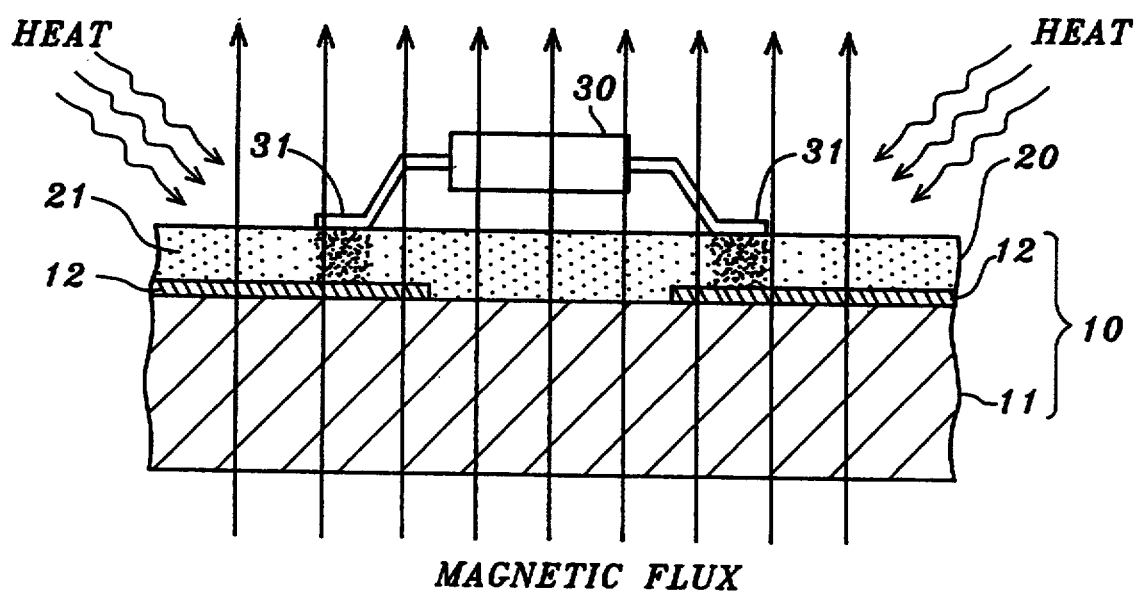
Figure 3:
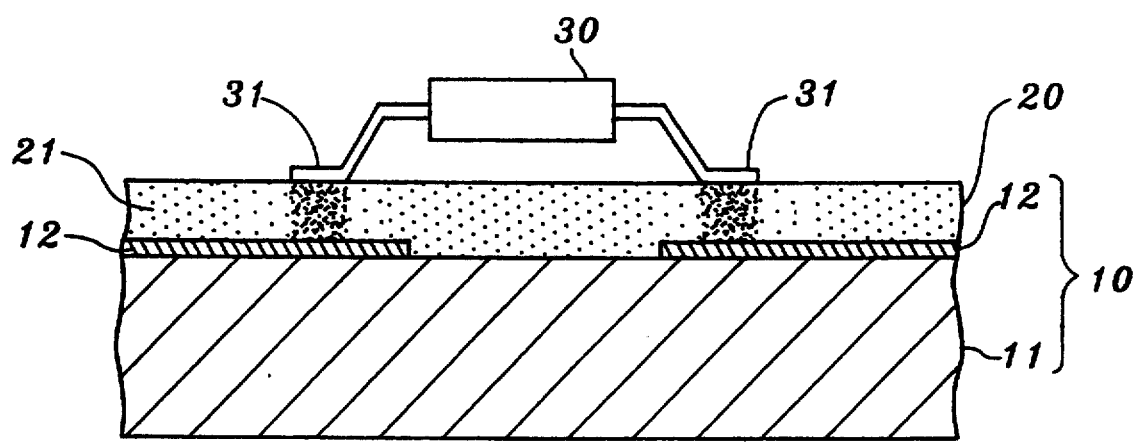
FIG. 3 shows an electrical connection between an IC package and a printed circuit board as a result of the procedural steps shown in FIGS. 2A-2F.

STEP (5): Hardening the Adhesive Layer (FIG. 2F)

With the magnetic field and the pressure still being applied, a heat treatment is performed to the adhesive layer 20 with a temperature of about 120° C. for about 8 minutes. After the heat treatment, the adhesive layer 20 is hardened such that the pins 31 of the IC package 30 are permanently bonded to the PCB 10 by the adhesive layer 20. The hardening of the adhesive layer 20 can also be achieved by illuminating with an infra-red lamp.

The present invention has been described with an exemplary preferred embodiment. However, it is to be understood that the scope of the present invention need not be limited to the disclosed preferred embodiment. On the contrary, it is intended to cover various modifications and similar arrangements within the scope defined in the following appended claims. The scope of the claims should be accorded the broadest interpretation so as to encompass all such modifications and similar arrangements.

What is claimed is:

1. A method of electrically interconnecting first conductors and second conductors, comprising, in the order recited:
   (a) providing a plurality of first and second conductors which are discrete and at least one of which plurality is made of soft magnetic material that can be temporarily magnetized;
   (b) arranging the plurality of first conductors in a predetermined arrangement on a surface of a substrate;
   (c) disposing an adhesive layer comprised of a mixture on the surface of the substrate and over the plurality of first conductors, the mixture being comprised of an adhesive and a predetermined concentration of conductive metal particles made of soft magnetic materials that can be temporarily magnetized, wherein the adhesive has a predetermined viscosity which allows the conductive metal particles to be suspended within the adhesive, and wherein the mixture is substantially insulating at the predetermined concentration of conductive metal particles;
   (d) arranging the plurality of second conductors above the layer of the mixture such that individual conductors of the plurality of second conductors are vertically aligned with the individual conductors of the plurality of first conductors;
   (e) heating the adhesive layer to reduce the viscosity of the mixture;
   (f) applying a magnetic field to the plurality of first and second conductors such that the conductive metal particles within the heated adhesive mixture are gathered by the magnetic field to produce a higher concentration of conductive metal particles between the aligned individual conductors of the plurality of first and the second conductors, and provide electrical interconnection therebetween, and to provide a lower concentration of conductive metal particles in adjacent areas of the layer; and
   (g) hardening the adhesive layer.

2. The method as claimed in claim 1, wherein the adhesive includes a polymeric resin having a viscosity ranging from 10,000 to 40,000 cps and from 10 wt % to 35 wt % of nickel particles.

3. The method as claimed in claim 1, wherein the adhesive layer is heated to a temperature ranging from 50° C. to 90° C. to reduce the viscosity of the mixture to be below 1000 cps.

4. The method as claimed in claim 1, wherein the applied magnetic field ranges from 200 Gauss to 4000 Gauss.

5. The method as claimed in claim 1, wherein the magnetic field is applied until the adhesive layer has been hardened.

6. The method as claimed in claim 1, wherein the adhesive layer is hardened by heat treatment at a temperature above 120° C. for a time period ranging from 4 minutes to two hours.

7. The method as claimed in claim 1, wherein the adhesive layer is hardened by illuminating the adhesive layer with an infra-red light beam.

* * * * *